(12) United States Patent
Wang

(10) Patent No.: US 10,058,003 B1
(45) Date of Patent: Aug. 21, 2018

(54) ELECTRONIC DEVICE STORAGE APPARATUS WITH AN ENHANCED SELF-LOCKING MECHANISM IN COMMUNICATION WITH A SLIDABLE COVER

(71) Applicant: Stan Yuming Wang, Irvine, CA (US)

(72) Inventor: Stan Yuming Wang, Irvine, CA (US)

( * ) Notice: Subject to any disclaimer, the term of this patent is extended or adjusted under 35 U.S.C. 154(b) by 0 days.

(21) Appl. No.: 15/490,767

(22) Filed: Apr. 18, 2017

Related U.S. Application Data

(60) Provisional application No. 62/297,017, filed on Feb. 18, 2016.

(51) Int. Cl.
| | |
|---|---|
| *H05K 7/14* | (2006.01) |
| *H05K 5/03* | (2006.01) |
| *H05K 5/02* | (2006.01) |
| *H01R 24/64* | (2011.01) |
| *H01R 107/00* | (2006.01) |

(52) U.S. Cl.
CPC ........... *H05K 7/1427* (2013.01); *H01R 24/64* (2013.01); *H05K 5/0217* (2013.01); *H05K 5/03* (2013.01); *H01R 2107/00* (2013.01)

(58) Field of Classification Search
CPC ...... H05K 7/1427; H05K 5/0217; H05K 5/03; H01R 24/64
See application file for complete search history.

(56) References Cited

U.S. PATENT DOCUMENTS

| | | | |
|---|---|---|---|
| 6,456,500 B1 * | 9/2002 | Chen .................... | H05K 5/0278 361/736 |
| 6,612,853 B2 * | 9/2003 | Wu ....................... | G06K 19/077 439/136 |
| 7,004,780 B1 * | 2/2006 | Wang .................... | H01R 13/60 361/752 |
| 7,674,120 B2 * | 3/2010 | Morganstern .... | G06K 19/07732 439/131 |
| 7,686,629 B1 * | 3/2010 | Yu ........................ | H01R 13/447 439/136 |
| 7,990,698 B2 * | 8/2011 | Lo ........................ | H05K 5/0278 361/679.4 |
| 8,194,408 B2 * | 6/2012 | Chou ................... | H01R 13/6658 361/737 |

(Continued)

*Primary Examiner* — Hoa C Nguyen
*Assistant Examiner* — Keith Depew
(74) *Attorney, Agent, or Firm* — Plager Schack LLP

(57) ABSTRACT

An electronic device storage apparatus with an enhanced self-locking mechanism in communication with a slidable cover is provided. The apparatus includes an electronic assembly having a connector coupled to a circuit board, an enclosure disposed around the circuit board such that the connector protrudes outside the enclosure, the enclosure having a pair of collapsible brackets mounted to the enclosure and designed to pivotably adjust to an open position away from the circuit board or a closed position against the circuit board, and a protective sheath slidably mounted to a portion of the enclosure and having an end opening. The collapsible brackets in the closed position slidably adjust relative to the protective sheath to a first locking position to extend the electronic assembly's connector through the end opening of the protective sheath for an exposure or a second locking position to retract the electronic assembly's connector within the protective sheath.

3 Claims, 3 Drawing Sheets

(56) References Cited

U.S. PATENT DOCUMENTS

| | | | |
|---|---|---|---|
| 8,837,134 B2* | 9/2014 | Huang | G06F 1/1613 312/223.2 |
| 2008/0280490 A1* | 11/2008 | Nguyen | G06F 12/1416 439/607.01 |
| 2012/0026661 A1* | 2/2012 | Ni | G06F 21/32 361/679.4 |

* cited by examiner

ELECTRONIC DEVICE STORAGE APPARATUS WITH AN ENHANCED SELF-LOCKING MECHANISM IN COMMUNICATION WITH A SLIDABLE COVER

RELATED APPLICATION

The application claims priority to provisional patent application U.S. Ser. No. 62/297,017 filed on Feb. 18, 2016, the entire contents of which is herein incorporated by reference.

BACKGROUND

The embodiments herein relate generally to electronic devices with a slidable protective cap. More specifically, embodiments of the present invention relate to electronic devices such as Universal Serial Bus (USB) devices designed to serve as portable memory storage devices.

USB devices are common portable devices used by individuals to conveniently store and/or transfer files or data between electronic devices such as computers, laptops, printers, other devices, and the like. Many of these USB devices comprise covers to protect the connectors when not in use. These covers slide on and off the connector of the USB device as needed.

One common problem of these USB devices is that the covers are easily lost or misplaced. This results in frustration by the user and/or the desire to purchase a new USB replacement device. In order to address this problem, a variety of USB devices have slidable covers that remain connected to the main body of the device as disclosed in U.S. Pat. No. 7,686,629. However, these USB devices are limited because they require the use of a plurality of separate mechanical components and/or snap fasteners to secure components of the device together such as the enclosure and main body. The use of an increased number of parts during the assembly of the USB device increases manufacturing and consumer costs.

As such, there is a need in the industry for an electronic device storage apparatus with a USB connector that addresses the limitations of the prior art, which reduces the number of components required during the assembly process. There is a further need in the industry for the electronic device storage apparatus to have an enhanced locking mechanism to secure the slidable cover to the apparatus.

SUMMARY

An electronic device storage apparatus with an enhanced self-locking mechanism in communication with a slidable cover is provided. The electronic device storage apparatus comprises an electronic assembly comprising a connector coupled to a circuit board, an enclosure disposed around the circuit board of the electronic assembly such that the connector protrudes outside the enclosure, the enclosure comprising a pair of collapsible brackets pivotably mounted to the enclosure and configured to pivotably adjust to an open position away from the circuit board or a closed position against the circuit board, and a protective sheath slidably mounted to a portion of the enclosure and comprising an end opening, wherein the pair of collapsible brackets in the closed position is configured to slidably adjust relative to the protective sheath to a first locking position to extend the connector of the electronic assembly through the end opening of the protective sheath for an exposure for use or a second locking position to retract the connector of the electronic assembly within the protective sheath for a storage. In certain embodiments, the connector of the electronic assembly is a USB connector.

BRIEF DESCRIPTION OF THE FIGURES

The detailed description of some embodiments of the invention will be made below with reference to the accompanying figures, wherein the figures disclose one or more embodiments of the present invention.

DETAILED DESCRIPTION OF CERTAIN EMBODIMENTS

Figure 1:
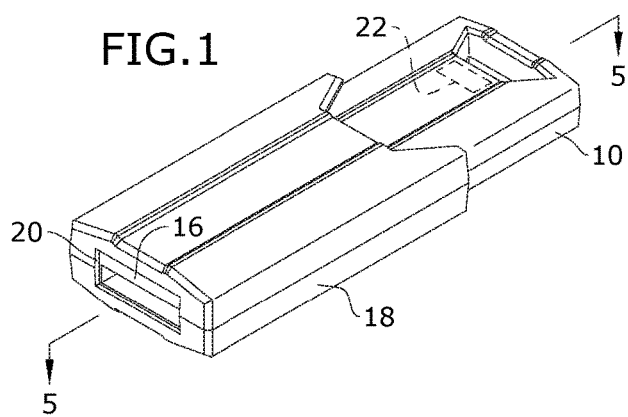
FIG. 1 depicts a perspective view of certain embodiments of the electronic device storage apparatus in a storage configuration.
Figure 2:
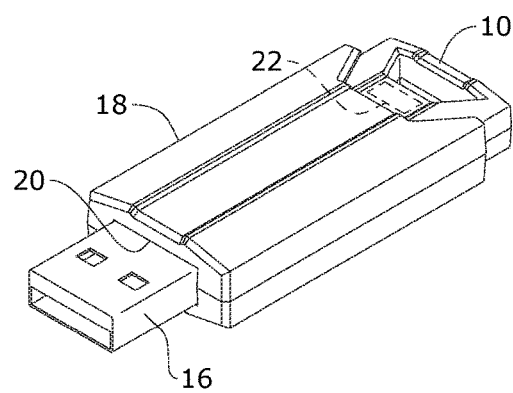
FIG. 2 depicts a perspective view of certain embodiments of the electronic device storage apparatus in an operational configuration.

As depicted in FIGS. 1-4, the electronic device storage apparatus is configured to store data in a memory storage unit and generally comprises an electronic assembly comprising circuit board 14 coupled to USB connector 16, protective sheath 18, and enclosure 10. As depicted in FIG. 1, protective sheath 18 is configured to slidably adjust relative to enclosure 10 to a storage configuration to retract USB connector 16 within protective sheath 18. As depicted in FIG. 2, protective sheath 18 is configured to slidably adjust relative to enclosure 10 to an operational configuration to extend USB connector 16 outside of protective sheath 18. In a preferred embodiment, the electronic device storage apparatus is made from plastic such as polyoxymethylene (POM). However, alternative polymers and materials may be used instead.

Figure 3:
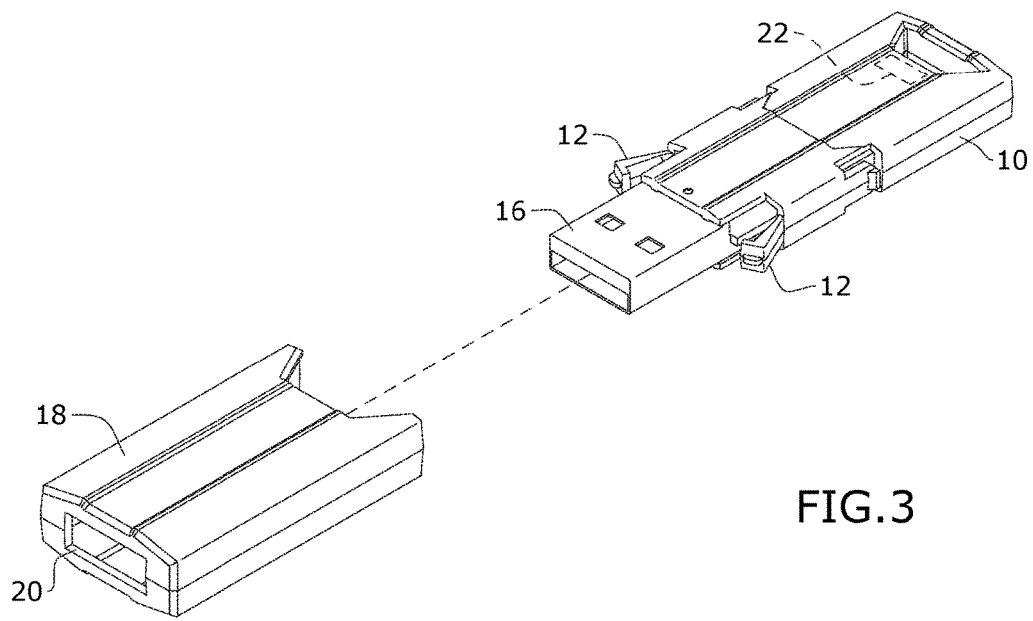
FIG. 3 depicts a perspective view of certain embodiments of the electronic device storage apparatus.
Figure 4:
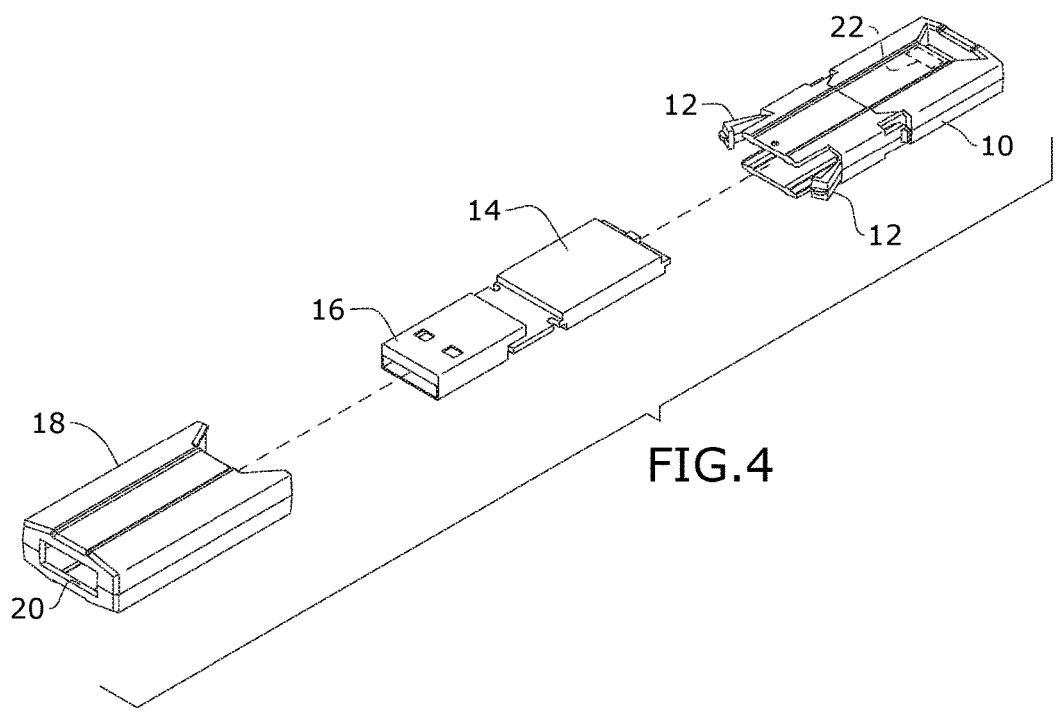
FIG. 4 depicts an exploded view of certain embodiments of the electronic device storage apparatus.

As depicted in FIGS. 3-4, circuit board 14 and USB connector 16 are configured to be inserted within enclosure 10 and protective sheath 18. Enclosure 10 comprises logo area 22 and a pair of collapsible brackets 12 pivotably mounted to opposing side walls of enclosure 10. Logo area 22 may comprise any combination of numbers, letters, symbols, and the like. Each collapsible bracket 12 is configured to be pivotably adjusted to an open and resting position as shown in FIGS. 3-4 or a closed position against circuit board 14. Enclosure 10 is disposed around circuit board 14 such that USB connector 16 protrudes outside of enclosure 10.

Figure 5:
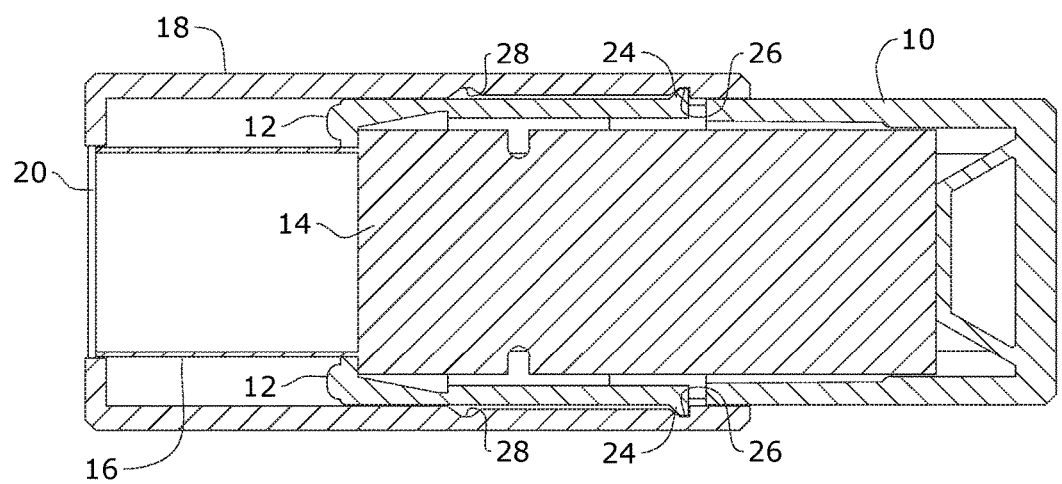
FIG. 5 depicts a section view of certain embodiments of the electronic device storage apparatus taken along line 5-5 in FIG. 1.
Figure 6:
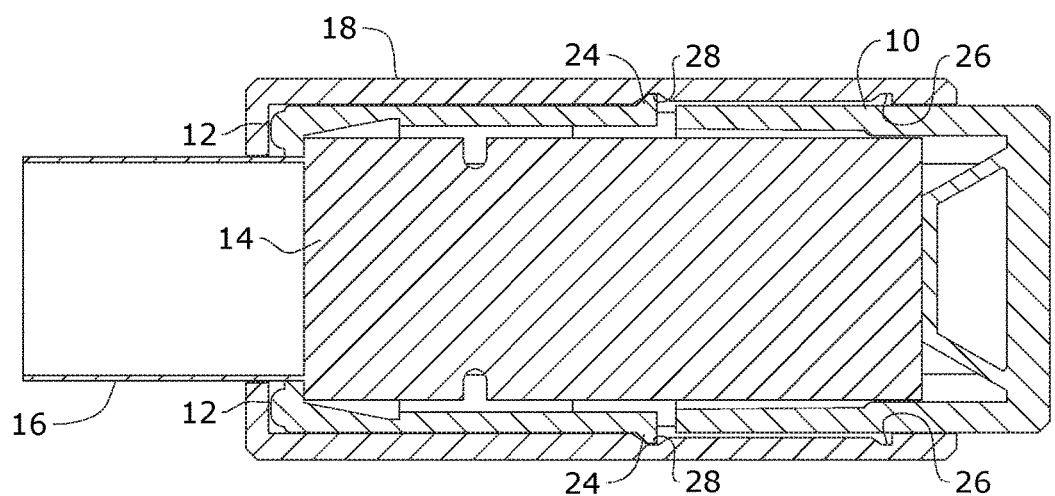
FIG. 6 depicts a section view of certain embodiments of the electronic device storage apparatus in the operational configuration.

Protective sheath 18 comprises opening 20 and is disposed around a portion of enclosure 10. As depicted in FIGS. 5-6, the pair of collapsible brackets 12 pivotably adjust to the closed positions against circuit board 14 when protective sheath 18 is disposed around collapsible brackets 12. In this position, circuit board 14 is secured within collapsible brackets 12 and enclosure 10.

Enclosure 10 further comprises a pair of locking tabs 24, which are configured to engage with either a pair of storage slots 26 or a pair of operational slots 28 in protective sheath 18. Storage slots 26 are aligned and positioned on opposing inner walls of protective sheath 18. Similarly, operational slots 28 are aligned and positioned on the opposing inner walls of protective sheath 18.

In operation, enclosure 10 is pushed or pulled to adjust the electronic device storage apparatus to the storage configuration or operational configuration. Enclosure 10 is pulled away from protective sheath 18 to adjust the electronic device storage apparatus to the storage configuration as depicted in FIGS. 1 and 5. This permits locking tabs 24 of enclosure 10 to slide along the opposing inner side walls of protective sheath 18 until locking tabs 24 engage with storage slots 26. This engagement prevents further movement and detachment of enclosure 10 and the electronic assembly from protective sheath 18. In this storage configuration, USB connector 16 is fully retracted within protective sheath 18.

Enclosure 10 is pushed into protective sheath 18 to adjust the electronic device storage apparatus to the operational configuration as depicted in FIGS. 2 and 6. This permits locking tabs 24 of enclosure 10 to slide along the opposing inner side walls of protective sheath 18 until locking tabs 24 engage with operational slots 28. This permits USB connector 16 to extend through opening 20 in protective sheath 18 for an exposure so that USB connector 16 can be used. In this operational configuration, the pair of collapsible brackets 12 contact the inner side wall of protective sheath 18 to prevent further movement of enclosure 10 and the electronic assembly in the same direction. Operational slots 28 prevent protective sheath 18 from moving out of position when the electronic device storage apparatus is inserted into the USB port of another device (not shown). In addition, operational slots 28 prevent USB connector 16 from retracting inside enclosure 10.

The electronic device storage apparatus is adjusted between the storage and operational positions as often as needed. Locking tabs 24 are compressible and resilient members that can adjust as they slide along the inner walls of protective sheath 18 and engage or disengage with storage slots 26 and operational slots 28.

It shall be appreciated that the components of the electronic device storage apparatus described in several embodiments herein may comprise any alternative known materials in the field and be of any color, size and/or dimensions. It shall be appreciated that the components of the electronic device storage apparatus described herein may be manufactured and assembled using any known techniques in the field.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. An electronic device storage apparatus with an enhanced self-locking mechanism in communication with a slidable cover, the electronic device storage apparatus comprising:
    an electronic assembly comprising a connector coupled to a circuit board;
    an enclosure disposed around the circuit board of the electronic assembly such that the connector protrudes outside the enclosure, the enclosure comprising a pair of collapsible brackets pivotably mounted to the enclosure and configured to pivotably adjust to an open position away from the circuit board or a closed position against the circuit board, the enclosure comprising a pair of locking tabs protruding from opposing side walls of the enclosure; and
    a protective sheath slidably mounted to a portion of the enclosure and comprising an outer surface, an inner surface and an end opening, the inner surface of the protective sheath comprising a pair of opposing inner walls comprising a first pair of recesses extending into the opposing pair of inner walls and a second pair of recesses extending into the opposing pair of inner walls;
    wherein the pair of collapsible brackets in the closed position permits the pair of locking tabs of the enclosure to slidably adjust against the pair of opposing inner walls of the protective sheath to engage with the first pair of recesses in a first locking position to extend the connector of the electronic assembly through the end opening of the protective sheath for an exposure for use, wherein the pair of collapsible brackets in the closed position permits the pair of locking tabs of the enclosure to slidably adjust against the pair of opposing inner walls of the protective sheath to engage with the second pair of recesses in a second locking position to retract the connector of the electronic assembly within the protective sheath for a storage.

2. The electronic device storage apparatus of claim 1, wherein the connector of the electronic assembly is a USB connector.

3. An electronic device storage apparatus with an enhanced self-locking mechanism in communication with a slidable cover, the electronic device storage apparatus comprising:
    an electronic assembly comprising a connector coupled to a circuit board;
    an enclosure disposed around the circuit board of the electronic assembly such that the connector protrudes outside the enclosure, the enclosure comprising a pair of collapsible brackets pivotably mounted thereto and a pair of locking tabs protruding from opposing side walls of the enclosure, each collapsible bracket in the pair of collapsible brackets comprising an arm pivotably adjustable relative to the electronic assembly, wherein the arm of each collapsible bracket in the pair of collapsible brackets pivotably adjusts to an open position with the arm extending at a slanted angle away from the circuit board of the electronic assembly, wherein the arm of each collapsible bracket in the pair of collapsible brackets pivotably adjusts to a closed position with the arm extending against the circuit board of the electronic assembly; and
    a protective sheath slidably mounted to a portion of the enclosure and comprising an outer surface, an inner surface and an end opening, the inner surface of the protective sheath comprising a pair of opposing inner walls comprising a first pair of recesses partially extending into the opposing pair of inner walls and a second pair of recesses partially extending into the opposing pair of inner walls;
    wherein the pair of collapsible brackets in the closed position permits the pair of locking tabs of the enclosure to slidably adjust against the pair of opposing inner walls of the protective sheath to engage with the first pair of recesses in a first locking position to extend the connector of the electronic assembly through the end opening of the protective sheath for an exposure for use, wherein the pair of collapsible brackets in the closed position permits the pair of locking tabs of the enclosure to slidably adjust against the pair of opposing inner walls of the protective sheath to engage with the second pair of recesses in a second locking position to retract the connector of the electronic assembly within the protective sheath for a storage.

\* \* \* \* \*